(12) United States Patent
Shiga (10) Patent No.: US 7,369,454 B2
(45) Date of Patent: May 6, 2008

(54) SEMICONDUCTOR INTEGRATED CIRCUIT DEVICE

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 11/193,462

(22) Filed: Aug. 1, 2005

(65) Prior Publication Data
US 2006/0203596 A1   Sep. 14, 2006

(30) Foreign Application Priority Data
Mar. 11, 2005   (JP) .............................. 2005-069152

(51) Int. Cl.
*G11C 8/00* (2006.01)
(52) U.S. Cl. ..................... 365/230.06; 365/189.07; 365/230.03
(58) Field of Classification Search .......... 365/230.06, 365/230.03, 189.07
See application file for complete search history.

(56) References Cited

U.S. PATENT DOCUMENTS

| 4,694,425 A | 9/1987 | Imel | |
| 4,755,974 A * | 7/1988 | Yamada et al. | ............... 365/49 |
| 5,848,021 A * | 12/1998 | Sugibayashi | ........... 365/230.06 |
| 6,421,264 B1 | 7/2002 | Hayakawa et al. | |
| 2005/0174862 A1* | 8/2005 | Watanabe et al. | ........... 365/200 |

FOREIGN PATENT DOCUMENTS

| JP | 10-124384 | 5/1998 |
| JP | 11-110283 | 4/1999 |

* cited by examiner

*Primary Examiner*—Son Dinh
(74) *Attorney, Agent, or Firm*—Oblon, Spivak, McClelland, Maier & Neustadt, P.C.

(57) ABSTRACT

A semiconductor integrated circuit device comprises several blocks including a word line connected with a memory cell, a row decoder selecting the word line, and a block decoder selecting the block. The block decoder includes a logical address register holding logical block address corresponding to the several blocks and a block status register holding a block status. The block decoder selects a block in which input block address and input block status match with held logical block address and held block status, respectively.

17 Claims, 11 Drawing Sheets

| | Block status | Value of register 31 | Value of register 32 |
|---|---|---|---|
| Physical block 1 | Data block 2 | 2h | 00b |
| Physical block 2 | Bad block | 0h | 11b |
| Physical block 3 | Spare block 1 | 1h | 01b |
| Physical block 4 | Data block 1 | 1h | 00b |
| Physical block 5 | Spare block 2 | 2h | 01b |

Mapping table

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-069152, filed Mar. 11, 2005, the entire contents of which are incorporated herein by reference.

BACKGROUND OF THE INVENTION

1. Field of the Invention

The present invention relates to a semiconductor integrated circuit device. In particular, the present invention relates to a semiconductor integrated circuit device having a non-volatile semiconductor memory device.

2. Description of the Related Art

In a non-volatile semiconductor memory device, for example, a NAND flash memory, reading and writing are carried out in units of pages (e.g., 2 KB) while erasing is carried out in units of blocks (e.g., 128 KB). As described above, the erase unit is larger than the write unit in the NAND flash memory. An overwrite operation in a flash memory will be described below.

An overwrite is carried out with respect to a page included in a logical block "a".

Data of the logical block "a" is held in a physical block (actual memory addresses) "A" in a flash memory space. In order to carry out an overwrite with respect to the flash memory, data stored in the overwrite page must be erased once. Moreover, in a NAND flash memory, data of the entire physical block including the page is erased in addition to the page. For this reason, the following operation is carried out.

A spare block (physical block) "B" is prepared. The spare block B is in an already erased state, and does not correspond to any logical blocks. All pages of the physical block "A" including the page having a write request are copied (in this case, data of the page to be overwritten is updated). Thereafter, the block including the old data is erased. The foregoing operation is carried out, and thereby, the data of the logical block "a" is held in the physical block B, and not the physical block "A".

In order to enable access, the flash memory prepares an address correspondence table (mapping table) of logical blocks and physical blocks. This technique is disclosed in JPN. PAT. APPLN. KOKAI Publications No. 10-124384 and No. 11-110283. More specifically, logical address/physical address conversion is carried out. In the conversion, a logical address/physical address conversion table, that is, a mapping table is used. Conversion means for converting a logical address into a physical address has a function of outputting a physical block address for a logical block address input. For example, if a logical block "a" is input, before the foregoing overwrite operation, a physical address corresponding to the physical block "A" is output. On the other hand, after the overwrite operation, an address corresponding to the physical block B is output. In the manner described above, access is made with respect to memory.

Conventionally, an SRAM is used for the logical address/physical address conversion. However, if an SRAM is used, an SRAM sense amplifier and control circuit for controlling the SRAM are required.

Moreover, a logical address decoder for decoding the logical address is required to access the SRAM. In addition, a physical address decoder for decoding the physical address output from the SRAM is required to access the flash memory. Thus, if the SRAM is integrated with a flash memory chip, an address decoder and address bus are required.

BRIEF SUMMARY OF THE INVENTION

A semiconductor integrated circuit device according to a first aspect of the present invention comprises:

several blocks including a word line connected with a memory cell;

a row decoder selecting the word line; and a block decoder selecting the block, including a logical address register holding a logical block address corresponding to the several blocks and a block status register holding a block status, and selecting a block in which an input block address and input block status match with the held logical block address and held block status, respectively.

A semiconductor integrated circuit device according to a second aspect of the present invention comprises:

several blocks including a word line connected with a memory cell;

a row decoder selecting the word line; and a block decoder selecting the block, and including a conversion table for converting an input block address into a physical address in a real memory space.

DETAILED DESCRIPTION OF THE INVENTION

Some embodiments of the present invention will be described below with reference to the accompanying drawings. In the following description, the same reference numerals are used to designate common components over all drawings.

First Embodiment

Figure 1:
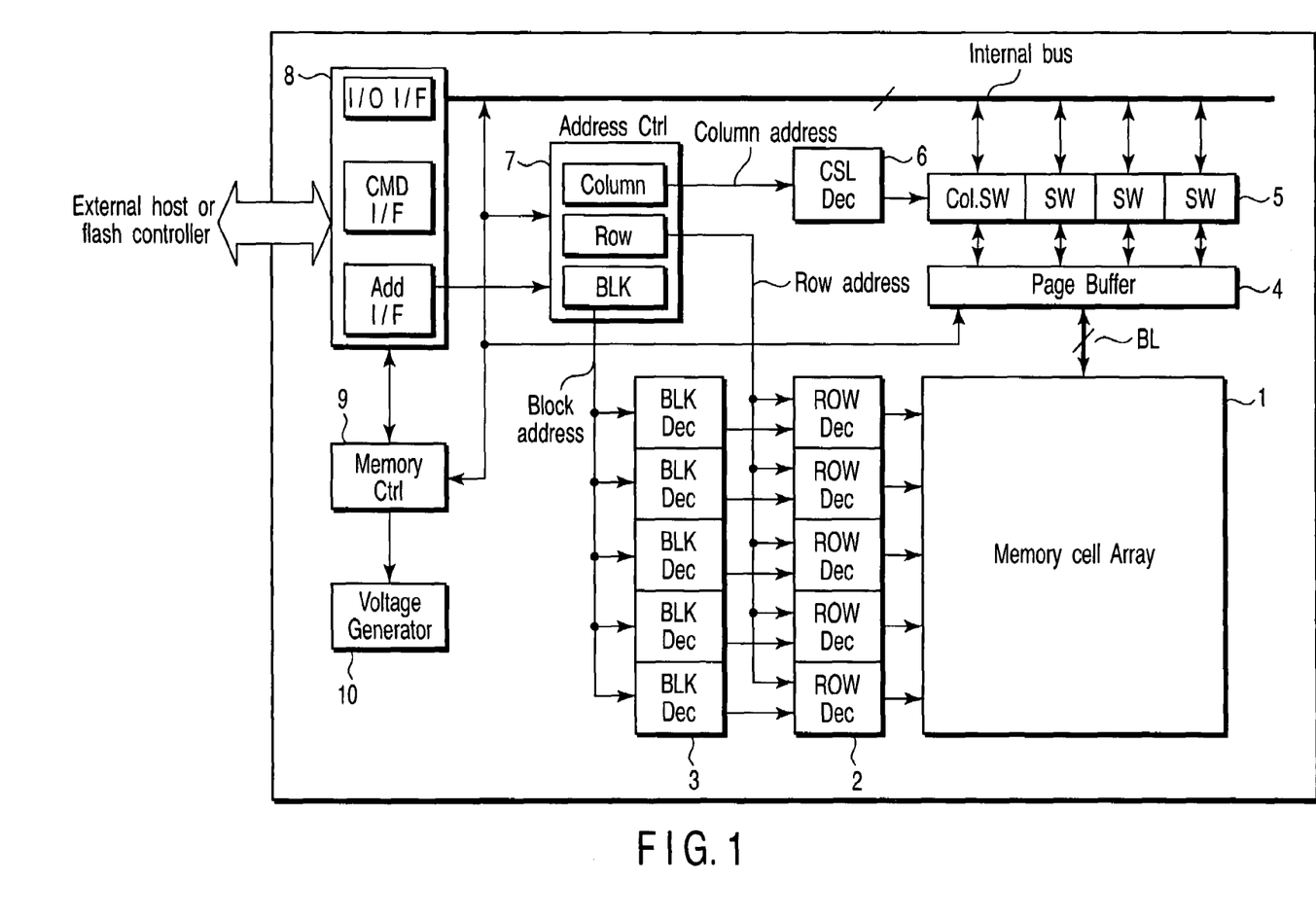
FIG. 1 is a block diagram showing the configuration of a non-volatile semiconductor memory device according to a first embodiment of the present invention.

FIG. 1 is a block diagram showing the configuration of a non-volatile semiconductor memory device according to a first embodiment of the present invention. In the first embodiment, a NAND flash memory is given as one example of the non-volatile semiconductor memory device. However, the present invention is applicable to various memories without being limited to the NAND flash memory.

Figure 2:
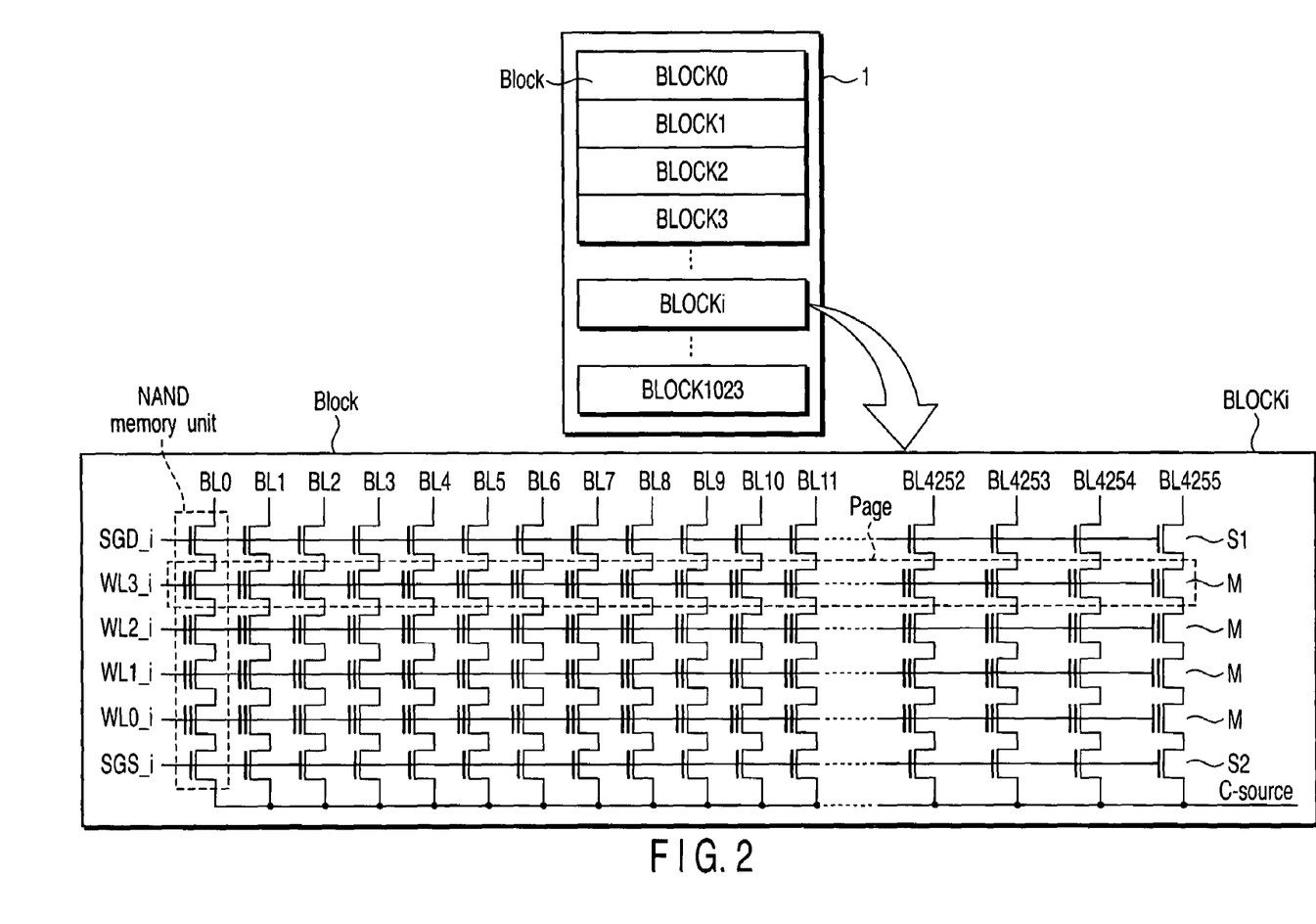
FIG. 2 is a view to explain the configuration of a memory cell array.

A word line WL of each memory cell of a memory cell array 1 is selected according to block address and row address of addresses specified by an address controller 7. The block address is inputted to a block decoder 3, and thereby, corresponding one block is selected. FIG. 2 is a view to explain the configuration of the memory cell array 1.

As shown in FIG. 2, the memory cell array 1 includes 1024 blocks BLOCK0 to BLOCK1023, for example. The block is the minimum unit of erase. One block "BLOCK" includes 4256 NAND memory units, for example. The NAND memory units each include several series-connected non-volatile semiconductor memory cell transistors M, for example, four memory cell transistors M, select gate transistors S1 and S2. The select gate transistor S1 is connected to one terminal of the column of four memory cell transistors M while the select gate transistor S2 is connected to the other terminal thereof. The gate of the select gate transistor S1 is connected to a drain select gate line SGD, and the current path is connected in series between the memory cell transistors M and a bit line BL. The gate of the select gate transistor S2 is connected to a source select gate line SGS, and the current path is connected in series between the memory cell transistors M and a cell source line C-source. The gates of four memory cell transistors M are connected individually to the corresponding word lines WL0 to WL3. Data write and read are simultaneously carried out with respect to 4256 memory cell transistors connected to one word line WL. One-bit or multi-bit data stored in one memory cell transistor M is collected 4256 in this embodiment, and then, the data thus collected form a page. The page is the minimum unit of write and read.

Usually, input block address is logical block address. According to this embodiment, the foregoing block decoder 3 holds logical block address corresponding to each physical block. A physical block having matching input address and hold address is selected.

The physical block selected by the block decoder 3 is inputted to a row decoder 2 using a circuit common to physical blocks having a select signal becoming high. The row decoder 2 corresponding to the block having a select signal becoming high selects one word line WL according to separately input row address.

The bit line BL of the memory cell is connected to a page buffer 4. The page buffer 4 has the functions described below. One is a sense amplifier (function) of sensing a bit line voltage (potential) in a read operation to determine memory cell data. Another is a write bias (function) of applying a predetermined voltage to the bit line in accordance with write data in a write operation. The read data is held in the page buffer 4. Thereafter, the page buffer 4 outputs column data specified by the output from a column select line decoder 6 to an internal bus via a column switch 5. On the other hand, if write data is inputted, data input to the internal bus is input to the page buffer 4 specified by the output from the column select line decoder 6 to an internal bus via the column switch 5.

A memory control circuit 9 controls address controller 7 and internal power-supply voltage generator circuit 10. In this case, the memory control circuit 9 controls these controller 7 and circuit 10 based on each sequence according to read, write or erase requests from an external host or flash memory controller, input to a chip interface circuit 8.

The operation of the block decoder 3 will be described below.

A logical block address is inputted to the block decoder 3. The block decoder 3 is provided one by one correspondingly to each physical block, and holds the corresponding logical block address data. If the input logical block address matches with the held logical block address, the block decoder 3 outputs a HIT signal. The HIT signal is input to the row decoder 2, and then, only corresponding physical block becomes active.

The block decoder 3 of this embodiment has the following functions.

1. Logical Access Mode

The block decoder 3 selects the physical block corresponding to the input logical block address. This is as described above.

2. Physical Access Mode

The block decoder 3 regards an input address as a physical block address, and selects the physical block corresponding to the input address.

3. Logical Address Input Mode

The block decoder 3 does not make access to physical block, but writes the input logical block address in an internal data hold section as data.

Figure 3:
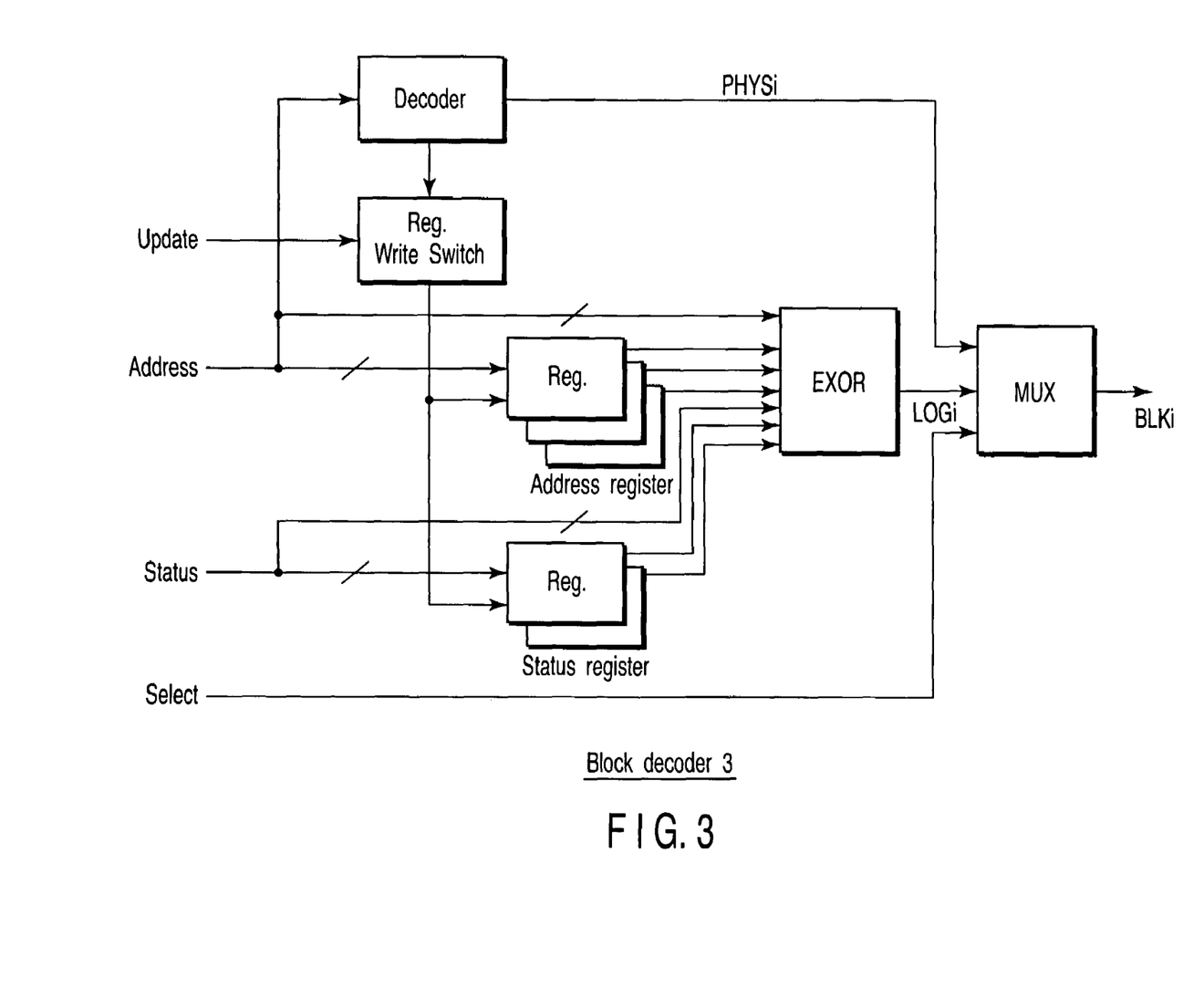
FIG. 3 is a block diagram showing the configuration of a block decoder.

FIG. 3 is a block diagram showing the configuration of the block decoder with respect to one physical block to realize the foregoing functions.

As shown in FIG. 3, the block decoder 3 includes logical address register 31, block status register 32, exclusive logical sum (OR) circuit 33, multiplexer 34, physical address decoder 35 and register write switch 36.

The logical address register 31 holds the corresponding logical block address.

The block status register 32 holds a block status of each block. The block status is information showing which of data block, spare block or bad block the block corresponds to.

The exclusive OR circuit (EXOR) 33 makes the exclusive OR operation of values of logical address registers 31, status register 32, input logical block address "Address" and input block status "Status" bit by bit. The EXOR circuit 33 outputs a logical hit signal (logical address decode result) LOGi when all bits are matching.

The multiplexer 34 makes a changeover of logical and physical access modes according to a select signal "Select". Then, the multiplexer 34 outputs any of logical hit signal (logical address decoding result) LOGi and physical address decoding result PHYSi as a block select signal BLKi.

The physical address decoder 35 is equivalent to a conventional block decoder. That is, the decoder 35 decodes physical block address, and outputs the foregoing physical address decoding result PHYSi.

The register write switch 36 makes control which of logical address register 31 or block status register 32 update data should be written according to an update signal "Update".

In the logical access mode, the status of the physical block 5 is largely classified into three statuses, that is, data block, spare block and bad block.

The data block is a block in which logical block address is assigned. In the data block, data is written.

The spare block is a block in which logical block address is not assigned. In the spare block, data is erased.

The bad block is a block in which access is inhibited.

Figure 4:
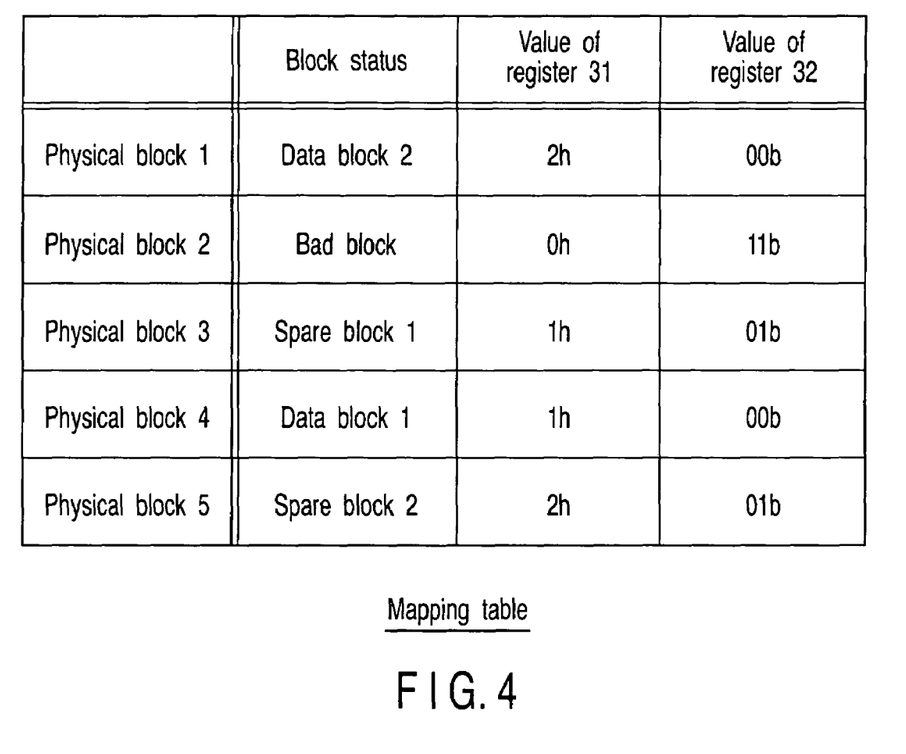
FIG. 4 is a table showing the relationship between logical address and status information.

The block decoder 3 holds flag information determining the foregoing three states, for example block status in the block status register 32 as table data in addition to the corresponding logical block address. FIG. 4 shows the relationship between the logical block address held in the logical address register 31 and the block status held in the block status register 32, that is, mapping table.

In the mapping table, the block status is set as follows.
00: Data block
01: Spare block
11: Bad block The mapping table shown in FIG. 4 is equivalent to a conversion table, which converts input block address into physical address in a real memory space. For example, the block decoder 3 refers to the conversion table to make an operation of selecting a block. In the first embodiment, the conversion table is configured as hardware using a register circuit. More specifically, the foregoing logical address register 31 and block status register 32 are used as a logical block address memory area for writing the logical block address and a block status memory area for writing the block status, respectively. The conversion table includes the foregoing logical block address memory area and block status memory area every several blocks, for example, all blocks. Incidentally, the conversion table is realized as software using programs.

(Logical Access Mode)

Logical block address is held as a value of the logical address register 31 with respect to the data block in which the value of the block status register 32 is "00".

No corresponding logical block exists with respect to the spare block in which the value of the block status register 32 is "01". For this reason, a spare block allocation table is held as a value of the logical address register 31. The allocation table is data equivalent to address in a spare block group to determine which spare block should be selected.

Access is inhibited with respect to the bad block in which the value of the block status register 32 is "11"; therefore, no access is usually made. The value of the logical address register 31 is undefined; in this embodiment, it is temporarily unified into 0h.

In the logical access mode, a block address control unit 41 of the address controller 7 shown in FIG. 1 sends status to be accessed to the block decoder 3 together with the logical block address. For example, if access is made with respect to the logical block 2, the control unit 41 (controller 7) outputs an access status "00b" together with address "2h". In this embodiment, a physical block 1 is selected as seen from FIG. 4.

If the spare block is selected for write, information (allocation table) showing which spare block should be selected is output as address together with a spare status "01b". For example, if a spare block 2 is selected, allocation table address "2h" is output together with the spare status "01b". In this embodiment, a physical block 5 is selected as seen from FIG. 4.

(Physical Access Mode)

In power-on mode and test mode having no defined mapping table, there exists the case where access is made using physical address and not logical address. For this reason, the block decoder 3 includes a conventional physical address decoder 35. When address corresponding to each physical block is inputted, the signal PHYSi becomes high. In the physical access mode, the multiplexer 34 selects the signal PHYSi according to the select signal "Select".

(Logical Address Input Mode)

The foregoing mapping table is a dynamic table. The logical block addresses corresponding to physical blocks 1 to 5 are variable every when memory repeats a write/erase operation. Thus, table data, that is, the values of registers 31 and 32 have a need to be updated.

In order to update the values of registers 31 and 32, the following method is employed.

A physical block to be updated is selected using physical block address. In other words, the corresponding physical block is defined using the physical decoder 35.

Logical block address and block status to be updated are input. Then, the logical block address to be updated is held in the logical block register 31 while the block status to be updated is held in the block status register 32. By doing so, table data, that is, the values of these registers 31 and 32 are updated.

The operation described above is controlled according the register write switch 36.

In the logical address input mode, no memory cell is actually selected. In order to prevent careless selection of the memory cell, control is carried out so that the output of the block decoder 3 does not become high.

According to the first embodiment, the block decoder has the conversion table for converting inputted logical address into physical address in the real memory space, that is, mapping table. The block decoder 3 selects a physical block corresponding to the inputted logical address according to the mapping table. The foregoing block decoder 3 is arranged together with a row decoder of a flash memory, and thereby, it is possible to remove physical address for making access to the flash memory.

Figure 12:
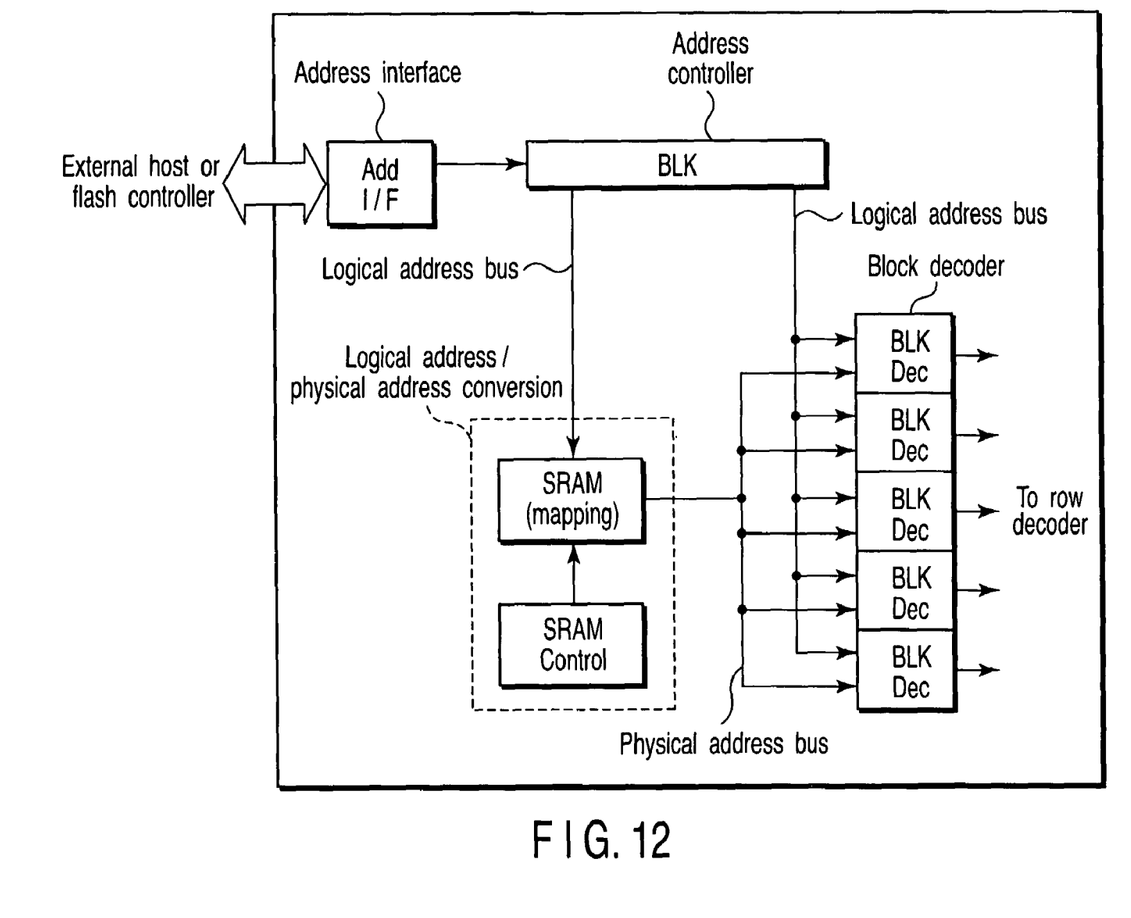
FIG. 12 is a block diagram showing the configuration of a semiconductor integrated circuit device according to a reference example of the present invention.

FIG. 12 shows a reference configuration. If an SRAM is used for logical address/physical address conversion, and the SRAM is integrated with a flash memory chip, the configuration shown in FIG. 12 is given. More specifically, SRAM (including SRAM (mapping), address decoder and sense amplifier) and control circuit (SRAM Control) are required. Moreover, the SRAM is integrated with a flash memory chip. For this reason, address decoder for SRAM and flash memory, physical address bus (output of SRAM) and logical address bus (output of address controller) are required double.

Conversely, in the first embodiment, the block decoder 3 has the mapping table; therefore, the SRAM may be eliminated. The SRAM is eliminated, and thereby, there is no need of providing address decoder and address bus double.

Therefore, according to the first embodiment, there is provided a semiconductor integrated circuit device having a non-volatile semiconductor memory device, which prevents the chip area from increasing, and has a logical address/physical address conversion function built in one chip.

Second Embodiment

Figure 5:
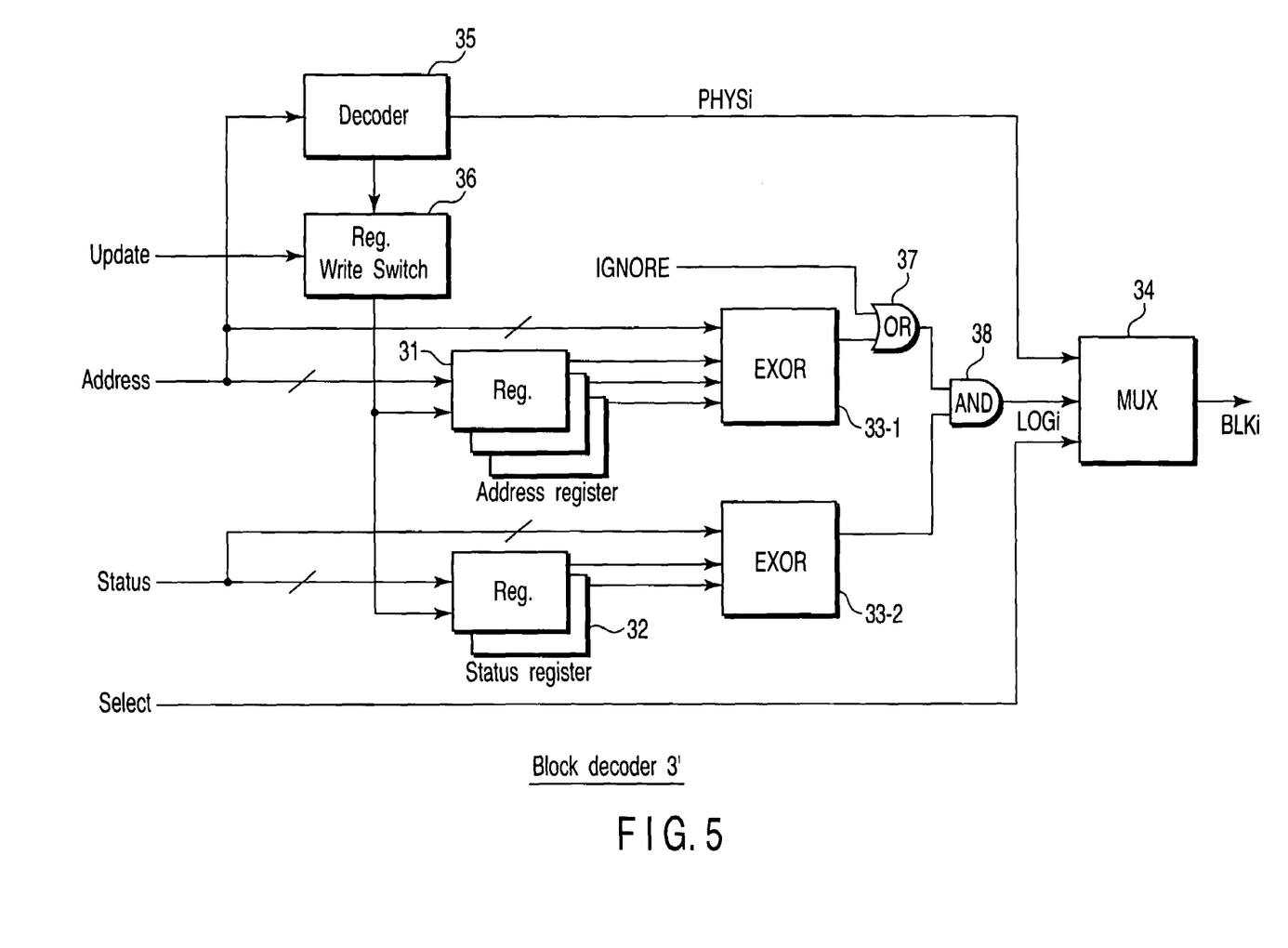
FIG. 5 is a block diagram showing the configuration of a block decoder built in a non-volatile semiconductor memory device according to a second embodiment of the present invention.

FIG. 5 is a block diagram showing the configuration of a block decoder built in a non-volatile semiconductor memory device according to a second embodiment of the present invention.

A block decoder 3' shown in FIG. 5 has a multiplex select function in addition to the same logical address/physical address conversion function as the first embodiment. The multiplex select function simultaneously selects several blocks having the same block status. A switchover of the foregoing two functions is made using a signal "IGNORE".

(Signal "IGNORE"=High)

If the block decoder 3' of the second embodiment sets a signal "IGNORE" high, the output of a logical sum circuit (OR) 37 is fixed at high regardless of the output of an exclusive logical sum circuit 33-1. In this case, one is ignore although the determinations given below is given. One is logical block address match/unmatch determination by an exclusive logical sum circuit (EXOR) 33-1. Another is block status match/unmatch determination by an exclusive logical sum circuit (EXOR) 33-2. Namely, the logical block address match/unmatch determination is ignored. In other words, the logical sum circuit 37 makes invalid the output of the exclusive logical sum circuit 33-1 regardless of the output thereof.

The output of the logical sum circuit 37, that is, high in this embodiment is given to one input of a logical product circuit (AND) 38. Therefore, the output of logical product circuit 38 takes a high or low level in accordance with the output of the exclusive logical sum circuit 33-2.

As described above, in the block decoder 3', only block status determination by the exclusive logical sum circuit (EXOR) 33-2 becomes valid while the signal "IGNORE" is high. Therefore, all of blocks in which block status held in the status register 32 and input block status "Status" match with each other is selected regardless of logical block address.

Now, referring to the mapping table shown in FIG. 4, if the input block status "Status" is "01b", spare blocks are all selected. In other words, physical blocks 3 and 5 are simultaneously selected.

(Signal "IGNORE"=Low)

This state is set when using the block decoder 3' in the logical access mode described in the first embodiment.

If the block decoder 3' sets the signal "IGNORE" low, the output of the logical sum circuit 37 takes a high or low level in accordance with the output of the exclusive logical sum circuit 33-1. The logical product circuit 38 sets the output to high when both outputs of the logical sum circuit 37 and the exclusive logical sum circuit 33-1 are high.

Therefore, the block decoder 3' outputs the logical hit signal LOGi if the following condition is satisfied like the first embodiment. Namely, the input logical block address matches with the value of the logical address register 31, and the input block status matches with the value of the block status register 32.

According to the second embodiment, several blocks, for example, several blocks having the same block status are simultaneously selected. Thus, it is advantageous to perform a high-speed operation in addition to the advantage obtained from the first embodiment.

Moreover, the number of bits of the block status register 32 is increased, for example, a new block status such as "erase select status" is set. By doing so, erase bias is simultaneously applied to memory cells of several blocks. This is advantageous to perform a high-speed erase operation.

Third Embodiment

The third embodiment relates to some application examples using the semiconductor integrated circuit device according to the embodiments of the present invention.

Figure 6:
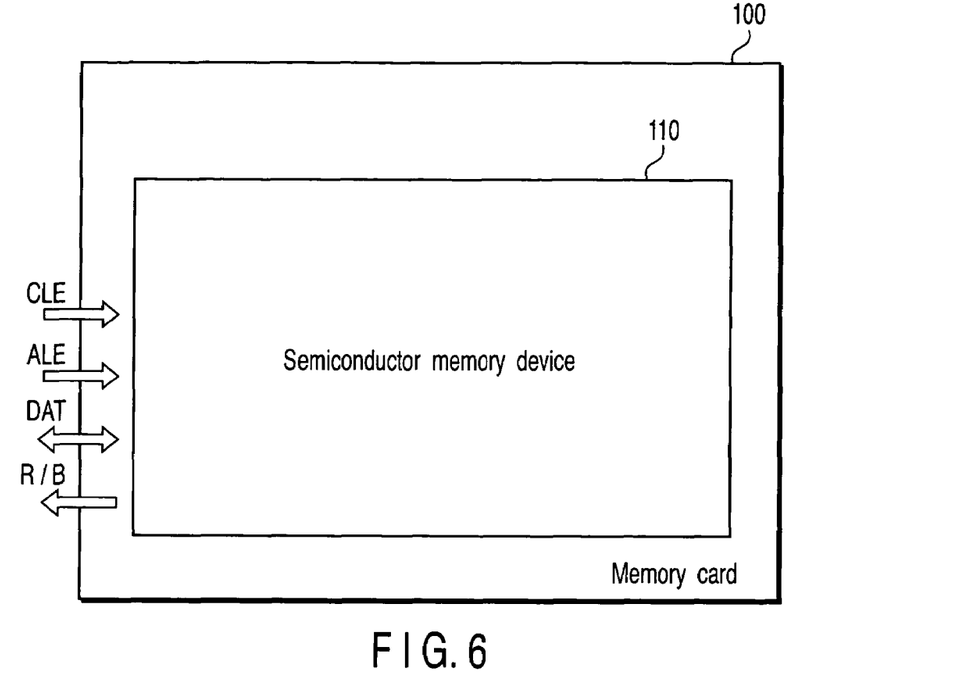
FIG. 6 is a view showing a memory card using a semiconductor integrated circuit device according to a third embodiment of the present invention.

FIG. 6 is a view showing a memory card using the semiconductor integrated circuit device according to the third embodiment of the present invention.

As illustrated in FIG. 6, a memory card 100 has a non-volatile semiconductor memory device 110. The semiconductor memory device 110 receives predetermined control signal and data from an external device (not shown). Moreover, the semiconductor memory device 110 outputs predetermined control signal and data to the external device (not shown).

The semiconductor memory device 110 built in the memory card 100 is connected with signal line (DAT), command line enable signal line (CLE), address line enable signal line (ALE) and ready/busy signal line (R/B). The signal line (DAT) transfers data, address or command. The command line enable signal line (CLE) shows that command is transferred to the signal line DAT. The address line enable signal line (ALE) shows that address is transferred to the signal line DAT. The ready/busy signal line (R/B) shows whether or not the semiconductor memory device 110 is operable.

Figure 7:
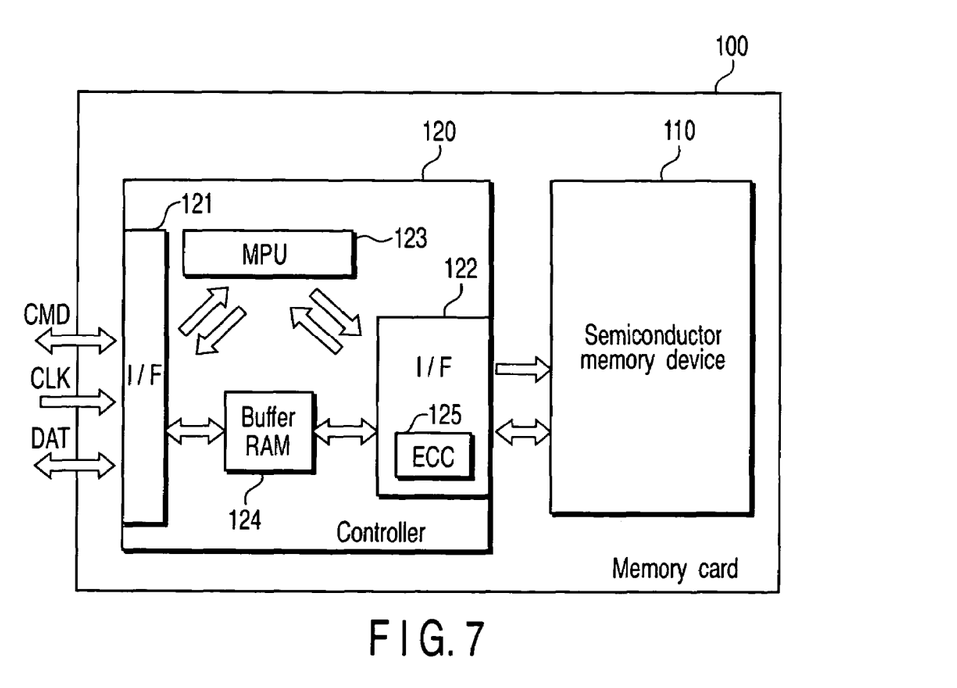
FIG. 7 is a view showing another memory card using a semiconductor integrated circuit device according to the third embodiment of the present invention.

FIG. 7 is a view showing another memory card using the semiconductor integrated circuit device according to the third embodiment of the present invention.

Another memory card shown in FIG. 7 differs from the memory card 100 shown in FIG. 6 in the following point. The memory card has a controller 120, which makes a predetermined signal exchange with an external device (not shown). The controller 120 is equivalent to a flash controller. The controller 120 includes interfaces (I/F) 121, 122, microprocessor (MPU) 123, buffer RAM 124 and error correction code 125. Specifically, the interfaces (I/F) 121 and 122 receive a predetermined signal from the semiconductor memory device 110 and an external device (not shown), or output it to the external device. The microprocessor (MPU) 123 makes a predetermined computation for converting logical address input from the external device into physical address. The buffer RAM 124 temporarily stores data. The error correction code unit 125 generates an error correction code. Moreover, the memory card 100 is connected with command signal line (CMD), clock signal line (CLK) and signal line (DAT).

In the foregoing memory cards 100, various modifications may be made with respect to the number of control signals, bit width of the signal line or the configuration of the controller 120.

Figure 8:
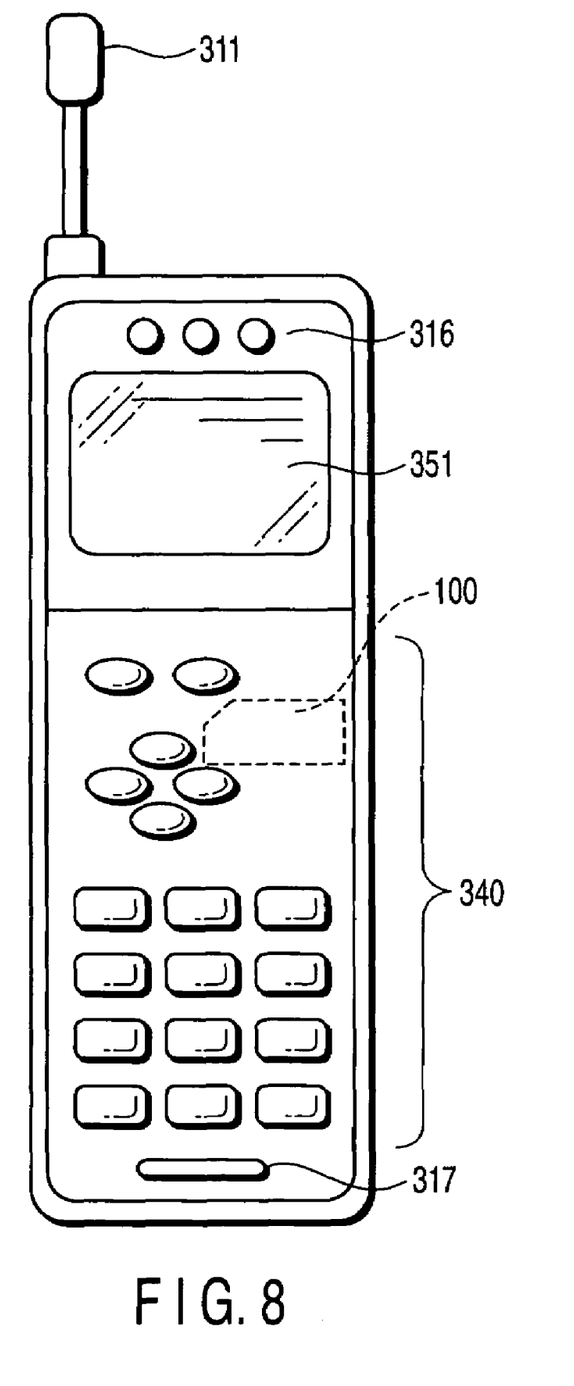
FIG. 8 is a view showing an electronic appliance using a semiconductor integrated circuit device according to the third embodiment of the present invention.

FIG. 8 is a view showing an electronic appliance using the semiconductor integrated circuit device according to the third embodiment of the present invention. In FIG. 8, there is shown a mobile electronic device, for example, mobile phone terminal as one example of the electronic appliance.

The foregoing embodiment relates to a non-volatile semiconductor memory device. The non-volatile semiconductor memory device is applicable to a rewritable ROM (EEPROM) built in the mobile phone terminal. Of course, the non-volatile semiconductor memory device is applicable to a ROM built in the mobile phone terminal in addition to the foregoing EEPROM.

Figure 9:
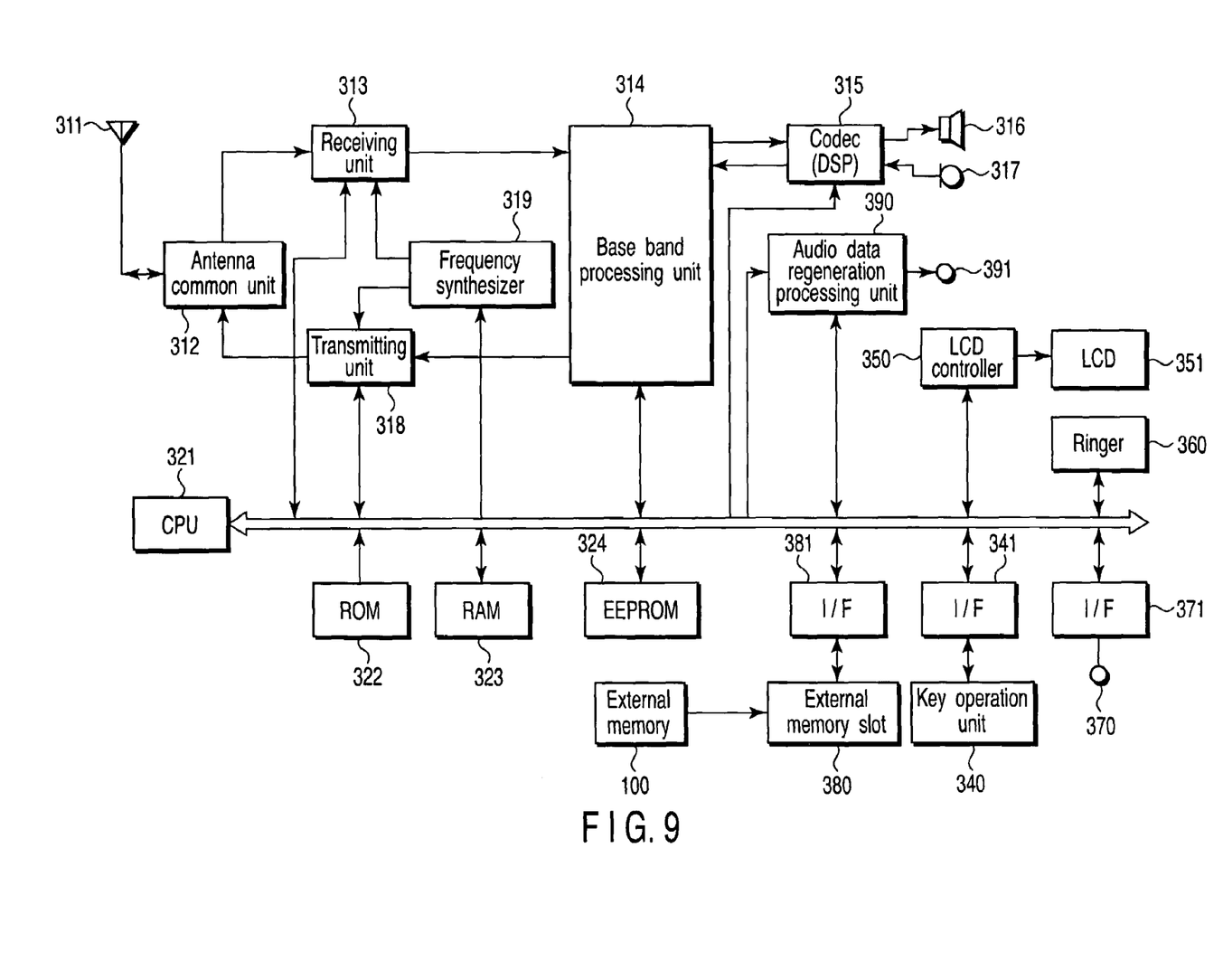
FIG. 9 is a block diagram showing the system configuration of a mobile phone terminal.

FIG. 9 is a block diagram showing the system configuration of the mobile phone terminal. The mobile phone terminal will be explained below with reference to the system configuration.

As depicted in FIG. 8 and FIG. 9, the mobile phone terminal includes communication section and control section. The communication section includes receiving/transmitting antenna 311, antenna common unit 312, receiving unit 313, base band processing unit 314, digital signal processor (DSP) 315 used as a voice codec. Further, the communication section includes speaker 316, microphone 317, transmitting unit 318 and frequency synthesizer 319.

The control section includes CPU 321, and ROM 322, RAM 323 and EEPROM 324, which are connected to the CPU 321 via a CPU bus 330. The ROM 322 stores programs executed by the CPU 321, for example, necessary data such as communication protocol and display font. The RAM 323 is mainly used as a work area. For example, the RAM 323 stores computing data during program execution by the CPU as the need arises, or temporarily stores data exchanged between the control section and other sections excluding the control section. The rewritable ROM (EEPROM) 324 is a non-volatile memory system, and even if the mobile phone terminal is powered off, data stored in the ROM 324 is not lost. Thus, the EEPROM 324 stores previous setting conditions, and if user operates the mobile phone terminal under available environment of giving the same setting conditions in the next power-on, stores these setting parameters. Therefore, the non-volatile memory system of the foregoing embodiment is applicable to the EEPROM, and of course, it is applicable to the ROM 322.

The mobile phone terminal of this embodiment further includes key operation unit 340, LCD controller 350, ringer 360, external input/output terminal 370, external memory slot 380 and audio data regeneration processing unit 390.

The key operation unit 340 is connected to a CPU bus 330 via an interface circuit (I/F) 341. Key input information key-input from the key operation unit 340 is sent to the CPU 321.

The LCD controller 350 receives display information from the CPU 321 via the CPU bus 330, and converts LCD control information for controlling a liquid crystal display (LCD) 351 to send it to the LCD 351.

The lingua 360 generates a call sound.

The external input/output terminal 370 is connected to the CPU bus 330 via an interface circuit 371. The terminal 370 functions as a terminal of externally inputting information to the mobile phone terminal or externally outputting it from there.

The external memory slot 380 is loaded with an external memory 400 such as memory card. The external memory slot 380 is connected to the CPU bus 330 via an interface circuit 381.

The mobile phone terminal is provided with the slot 380, and thereby, the following matters are achieved. More specifically, it is possible to write information from the mobile phone terminal to the external memory 100, or to read information stored in the external memory 100, and thereafter, to input it to there. The external memory 100 is a memory card, for example. The memory card has a non-volatile semiconductor memory device as the storage unit as described before. Thus, the non-volatile semiconductor memory device of the foregoing embodiment is applicable to the memory card.

The audio data reproduction processing unit 390 reproduces audio information input to the mobile phone terminal or audio information stored in the external memory 400. The reproduced audio information is sent to headphone and portable speaker via an external terminal 391, and thereby, externally fetched. For example, the mobile phone terminal is provided with the audio data reproduction processing unit 390, and thereby, audio information reproduction (playback) is possible.

As described above, the non-volatile semiconductor memory device according to the embodiment of the present invention is applicable to electronic appliances, for example, mobile phone terminal and memory card.

Figure 10A:
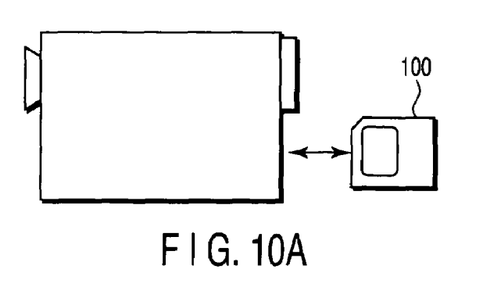
FIGS. 10A to 10F are views showing electronic appliances each using a memory card using a semiconductor integrated circuit device according to the third embodiment of the present invention.
Figure 10B:
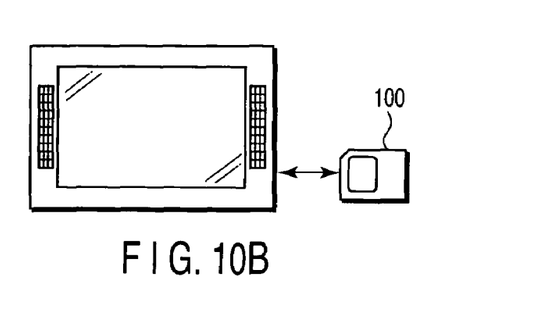
Figure 10C:
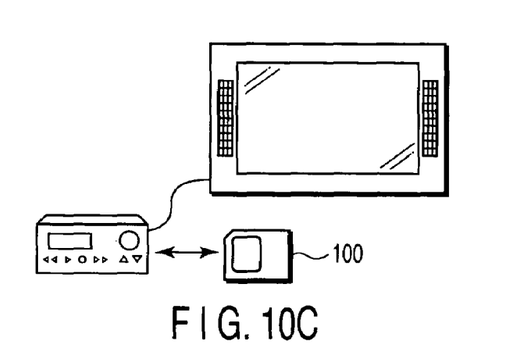
Figure 10D:
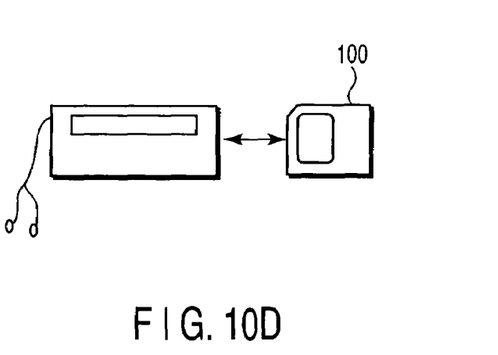
Figure 10E:
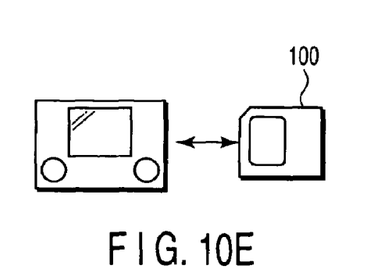
Figure 10F:
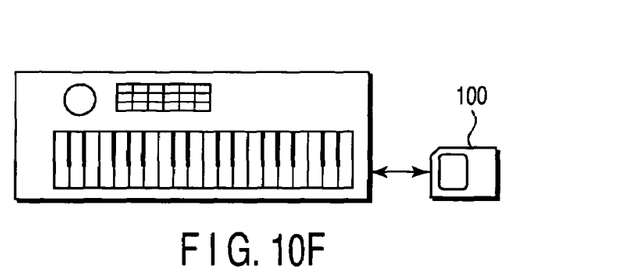
Figure 11A:
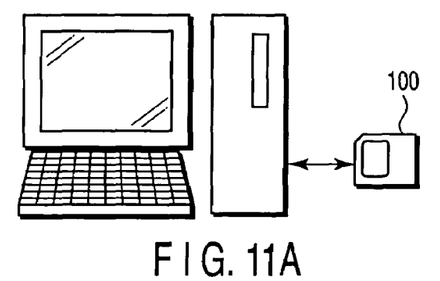
FIGS. 11A to 11E are views showing electronic appliances each using a memory card using a semiconductor integrated circuit device according to the third embodiment of the present invention.
Figure 11B:
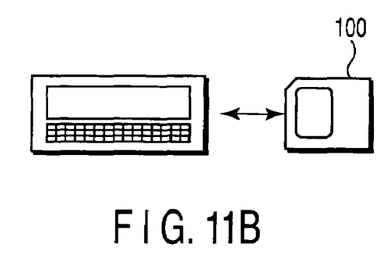
Figure 11C:
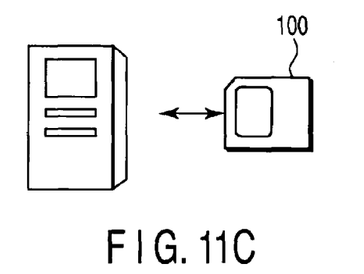
Figure 11D:
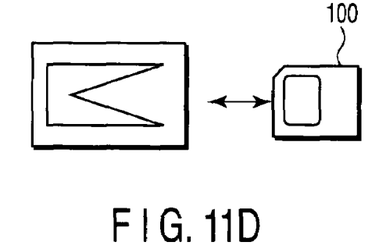
Figure 11E:
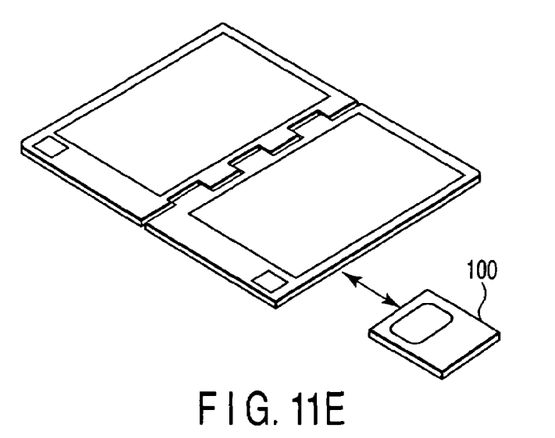

Moreover, the memory card 100 using the non-volatile semiconductor memory device according to the present invention is applicable as recording media of electronic appliances shown in FIGS. 10A to 10F and FIGS. 11A to 11E, for example. The electronic appliances include digital still camera/video camera (FIG. 10A), television (FIG. 10B), audio/visual appliance (FIG. 10C), audio appliance (FIG. 10D), game machine (FIG. 10E) and electronic music instrument (FIG. 10F). Further, the electronic appliances includes personal computer (FIG. 11A), personal digital assistant (PDA) (FIG. 11B), voice recorder (FIG. 11C), PC card (FIG. 11D and electronic book terminal (FIG. 11E).

According to the third embodiment, there is provided a semiconductor integrated circuit device having a non-volatile semiconductor memory device, which prevents the chip area from increasing, and has a logical address/physical address conversion function built in one chip.

Some embodiments of the present invention have been described above; however, the present invention is not limited to the foregoing embodiments. Various modifications may be possible within the scope without departing from the subject matter of this invention.

For example, in the foregoing embodiments, the block decoder includes the conversion table (mapping table) having the following memory area. One is the logical block address memory area (logical address register 31) for writing logical block address, and another is the block status memory area (block status register 32) for writing block status. In this case, the following modification may be made; more specifically, the conversion table may have the logical block address memory area only, or have the block status memory area only.

The foregoing embodiments are solely carried out; in this case, these embodiments may be properly combined.

The foregoing embodiments include various stage inventions, and several components disclosed in the foregoing embodiments are properly combined, thereby extracting various stage inventions.

In the foregoing embodiments, the present invention is applied to a non-volatile semiconductor memory device, in particular, a NAND flash memory. However, the present invention is not limited to the NAND flash memory. A semiconductor integrated circuit device having a built-in non-volatile semiconductor memory device, for example, a processor and system LSI belong to the category of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    several blocks including a word line connected with a memory cell;
    a row decoder selecting the word line; and
    a block decoder selecting the block, including a logical address register holding logical block address corresponding to said several blocks and a block status register holding a block status, and selecting a block having in which input block address and inputted block status matching with held logical block address and held block status, respectively.

2. The device according to claim 1, wherein the block decoder further includes a physical address decoder,
    the block decoder selects a block in which an input block address matches with held logical block address in a logical access mode, and decodes the input block address using the physical address decoder, and thereafter, selects according to the decoding result.

3. The device according to claim 2, wherein the block decoder decodes the input block address using the physical address decoder when updating the held logical block address and the held block status, and selects the logical address register and the block status register corresponding to the block to be updated according to the decoding result.

4. The device according to claim 1, wherein the block decoder further includes:
    a first match/unmatch detection circuit detecting match/unmatch of the input block address with the held logical block address;
    a second match/unmatch detection circuit detecting match/unmatch of the input block status with the held block status; and
    a circuit making invalid the output of the first match/unmatch detection circuit.

5. The device according to claim 2, wherein the block decoder further includes:
    a first match/unmatch detection circuit detecting match/unmatch of the input block address with the held logical block address;
    a second match/unmatch detection circuit detecting match/unmatch of the input block status with the held block status; and
    a circuit making invalid the output of the first match/unmatch detection circuit.

6. The device according to claim 3, wherein the block decoder further includes:
    a first match/unmatch detection circuit detecting match/unmatch of the input block address with the held logical block address;
    a second match/unmatch detection circuit detecting match/unmatch of the input block status with the held block status; and
    a circuit making invalid the output of the first match/unmatch detection circuit.

7. A semiconductor integrated circuit device comprising:
    several blocks including a word line connected with a memory cell;
    a row decoder selecting the word line; and
    a block decoder selecting the block, and including a conversion table for converting an input block address into a physical address in a real memory space
    wherein the conversion table includes a block status memory area for writing a block status every said several blocks.

8. The device according to claim 7, wherein the conversion table further includes a logical block address memory area for writing a logical block address every said several blocks.

9. The device according to claim 8, wherein the block decoder selects a block in which the input block address and the logical block address written in the logical block address memory area match with each other.

10. The device according to claim 7, wherein the block decoder selects a block in which the input block status and the block status written in the block status memory area match with other.

11. The device according to claim 8, wherein the block decoder selects a block in which the input block address and the logical block address written in the logical block address memory area match with each other and the input block status and the block status written in the block status memory area match with other.

12. The device according to claim 8, wherein the block decoder executes any of the following operations of:
    selecting a block in which the input block address and the logical block address written in the logical block address memory area match with each other and the input block status and the block status written in the block status memory area match with other; and
    selecting all blocks in which the input block status and the block status written in the block status memory area match with other.

13. The device according to claim 8, wherein the logical block address memory area is configured using a register circuit.

14. The device according to claim 7, wherein the block status memory area is configured using a register circuit.

15. The device according to claim 8, wherein the logical block address memory area and the block status memory area are configured using a register circuit.

16. A semiconductor integrated circuit device comprising:
    several blocks including a word line connected with a memory cell;
    a row decoder selecting the word line; and
    a block decoder selecting the block, and including a conversion table for converting an input block address into a physical address in a real memory space
    wherein the block decoder further includes a physical address decoder and the block decoder executes any of the following operations of selecting the block referring to the conversion table and selecting the block using the physical address decoder.

17. The device according to claim 16, wherein the block decoder further executes an operation of updating the conversion table.

* * * * *